United States Patent [19]

Lemaire

[11] Patent Number: 5,510,742

[45] Date of Patent: Apr. 23, 1996

[54] MULTIPLEXER RECEIVING AT ITS INPUT A PLURALITY OF IDENTICAL, BUT OUT OF PHASE, SIGNALS

[75] Inventor: Frédéric Lemaire, Saint Egreve, France

[73] Assignee: SGS-Thomson Microelectronics S.A., Saint-Genis Pouilly, France

[21] Appl. No.: 140,747

[22] Filed: Oct. 21, 1993

[30]    Foreign Application Priority Data

Oct. 30, 1992 [FR] France .................. 92 13432

[51] Int. Cl.⁶ ............................................ H03K 5/13
[52] U.S. Cl. .................... 327/146; 327/145; 327/407; 377/48
[58] Field of Search ........................ 307/243, 236; 370/112; 328/155, 55, 152, 154; 377/48, 49, 47, 78; 327/261, 141, 145, 405, 407, 24, 41, 44, 146

[56]    References Cited

U.S. PATENT DOCUMENTS

| | | | |
|---|---|---|---|
| 4,285,052 | 8/1981 | Bobbitt | 370/112 |
| 4,825,105 | 4/1989 | Holzle | 302/243 |
| 4,855,616 | 8/1989 | Wang et al. | 327/145 |
| 5,189,685 | 2/1993 | Jaffard et al. | 377/48 |
| 5,255,213 | 10/1993 | Wasserman | 302/49 |
| 5,329,529 | 7/1994 | Murphy et al. | 370/112 |

Primary Examiner—Timothy P. Callahan
Assistant Examiner—Dinh T. Le
Attorney, Agent, or Firm—David M. Driscoll; James H. Morris; John N. Anastasi

[57]    ABSTRACT

A multiplexer includes $2^{q+1}$ inputs receiving periodic signals, each signal being out of phase with respect to the other signals, and is controlled so as to switch from a present input signal to a next input signal by activation of a switch signal. The next signal has its phase delayed with respect to the present signal by $360°/2^{q+1}$. The switching signal is synchronized with an edge of the next input signal.

15 Claims, 3 Drawing Sheets

MULTIPLEXER RECEIVING AT ITS INPUT A PLURALITY OF IDENTICAL, BUT OUT OF PHASE, SIGNALS

BACKGROUND OF THE INVENTION

1. Field of the Invention

The present invention relates to multiplexers and more particularly to a multiplexer including $2^{q+1}$ input signals, where 9 is an integer and greater or equal one each input signal out of phase with respect to the other input signals by $360°/2^{q+1}$ and which input signals are successively selected according to increasing phase delays.

2. Discussion of the Related Art

A multiplexer receiving such signals is particularly useful to fabricate a fast operating divider by $2^{m+}\frac{1}{2}$, such as the divider described in U.S. Pat. No. 5,189,685.

FIG. 1 schematically represents the divider by $2^{m+}\frac{1}{2}$ of the above-mentioned patent application. Such divider includes a multiplexer 10 receiving for example 8 input signals S1–S8 provided by a 4-bit counter 12 of the Johnson-type, whose particularity is to provide identical signals, each signal being out of phase with respect to the other signals by a constant value; in this example, by 360°/8. Counter 12 receives signal F to be divided. The output 01 of multiplexer 10 is provided to a divider by $2^n$, where "n" is an integer 14, whose output provides the circuit output signal[0. Signal 0 is further looped back through a control circuit 16 of multiplexer 10. The control circuit 16 is operable to change the selection of multiplexer 10 at each predetermined edge of signal 0. Multiplexer 10 is controlled to successively provide at each switching the input signals in the order of increasing phase delays. In the example of FIG. 1, a particularly fast divider by $2^{n+2}+\frac{1}{2}$ is provided.

Hereinafter, Si designates the current signal selected in multiplexer 10, and Si+1 designates the next signal to be selected (i or i+1=1, 2 . . . 8).

FIG. 2 is a timing diagram of the signals in FIG. ]in three different situations delineated by two vertical dotted lines. FIG. 2 shows the signal F to be divided; signals Si and Si+1; output signal 0 of the divider by $2^{m+}\frac{1}{2}$ having three different delay values, $T_1$, $T_2$, $T_3$; and output signal 01 of multiplexer 10. Signals Si and Si+1 are identical and have a 50% duty cycle. Signal Si+1 has a phase lag with respect to signal Si corresponding to one half-period of signal F (which corresponds to ⅛ of the period of signal Si or Si+1, or still to 360° /8).

In FIG. 2 are represented at times $t_1$, $t_2$ and $t_3$ three rising edges of signal 0, each of which causes switching of multiplexer 70 from signal Si to signal Si+1. The aim of switching from one signal to the next one is to "swallow" a half-period of signal F, which provides term ½ in the division ratio $2^{m+}\frac{1}{2}$.

Switchings occur aft times that depend on the delay introduced by divider 14, the delay of the control circuit being here neglected for the sake of simplification. This delay corresponds to the switching delay of n latches if divider 74 is a divider by 2n. Ideally, the switching operations occur at times analogous to times $t_1$ and $t_2$ when signals Si and Si+1 have a same logic state. In this case, the current phase (high state at time $t_1$ and low state at time $t_2$) of signal 01 is prolonged by one half-period of signal F.

Time $t_3$ corresponds to a switching time that is to be avoided. Switching occurs while signals Si and Si+1 are at different logic states. In FIG. 2, time $t_3$ occurs when signal Si is high while signal Si+1 is not yet high. The output signal 01 of multiplexer 70 has, between time $t_3$ and the next rising edge of signal Si+1, an undesirable low state. Then, signal 01 has an additional edge causing erroneous counting by divider 14.

In a given technology, the delay introduced in divider 14 is approximately known. The circuit is designed so that the switching operations of multiplexer 10 occur when the current signal Si and the next signal Si+1 to be selected have the same state. However, if the input frequency F varies, the switching time slides, for example, from a situation corresponding to time $t_2$ to an inappropriate situation corresponding to time $t_3$. Therefore, the divider of FIG. 1 can operate within a limited frequency range only.

SUMMARY OF THE INVENTION

An object of the invention is to provide a multiplexer structure for extending the frequency range of a divider such as shown in FIG. 1.

This object is achieved with a multiplexer that includes $2^{q+1}$ inputs that receive periodical signals, each signal being out of phase with respect to the other signals. The multiplexer is controlled so as to switch from a present input signal to a next input signal in response to the activation of a switching signal, the next signal having a phase delayed with respect to the present signal by $360°/2^{q+}1$. Means are provided to synchronize the switching signal with an edge of the next input signal.

According to an embodiment of the invention, the multiplexer includes: a first and a second multiplexer receiving respectively $2^q$ input signals of odd rank and $2^q$ input signals of even rank; a third multiplexer receiving at the first and second inputs the output signals of the first and second multiplexers, respectively, and providing the output signal of the multiplexer with $2^{q+}1$ inputs; a fourth multiplexer receiving at first and second inputs the output signals of the second and first multiplexers, respectively; a latch receiving at a data input the switching signal through a divider by 2, receiving at its clock input the output of the fourth multiplexer, and providing the selection signal of the third and fourth multiplexers; and means for controlling the first and second multiplexers switching the selection of the first multiplexer on each odd activation of the switching signal, and switching the selection of the second multiplexer on each even activation of the switching signal. The foregoing and other objects, features, aspects and advantages of the invention will become apparent from the following detailed description of the present invention when taken in conjunction with the accompanying drawings.

DETAILED DESCRIPTION

The present invention is directed to a multiplexer structure to be used :in a divider such as the one shown in FIG.

1, ensuring that switching from a current signal Si to a next signal Si+1 to be selected always occurs immediately after a phase when signals Si and Si+1 are at different stares. To obtain this result, the invention proposes to synchronize switching of the multiplexer with either one of the edges of the next signal Si+1 to be selected.

Figure 3:
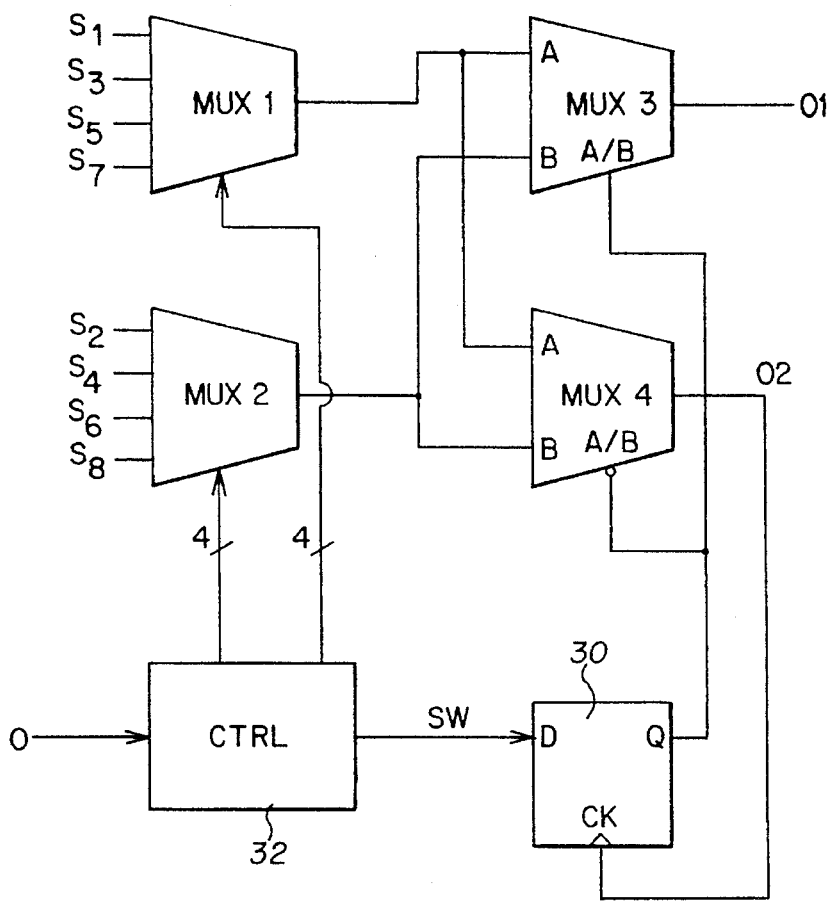
FIG. 3 represents an embodiment of a multiplexer according to the invention.

FIG. 3 represents an embodiment of a multiplexer according to the invention receiving, for example, 2q+1 where 9 equals 2 input signals S1–S8. Such multiplexer corresponds to the elements surrounded in FIG. 1 by a rectangle drawn in dotted lines.

Such multiplexer includes a first 4-channel multiplexer MUX1 receiving signals S of an odd rank provided by counter 12, and a second 4-channel multiplexer MUX2 receiving signals S of an even rank. Two 2-channel multiplexers MUX3 and MUX4 receive at input A the output of multiplexer MUX1 and, at input B, the output of multiplexer MUX2. The output Q of a D-type latch 30 selects, by a "1", channel A of multiplexer MUX3 and channel B of multiplexer MUX4. The state "0" of output Q selects channel B of multiplexer MUX3 and channel A of multiplexer MUX4. The output of multiplexer MUX3 forms the output O1 of multiplexer 10 of FIG. 1. The output O2 of multiplexer MUX4 is connected to the clock input of latch 30. Multiplexers MUX1 and MUX2 are controlled by a control circuit 32 receiving the output signal 0 of the divider by $2^{m+1}/2$ and providing a signal SW at the data input of latch 30.

The control circuit 32 controls multiplexers MUX1 and MUX2 as follows. Initially, a signal Sj (j=1 ... 8) is selected in multiplexer MUX1, and a signal Sj+1 is selected in multiplexer MUX2. At the occurrence of a falling edge, for example, of signal 0, the control circuit 32 selects in multiplexer MUX1 signal Sj+2, and signal Sj+1 remains :selected in multiplexer MUX2. At the next falling edge of signal 0, the control circuit 32 selects signal Sj+3 in multiplexer MUX2, and signal Sj+2 remains selected in multiplexer MUX1, and so forth. Thus, multiplexer MUX1 is switched at each falling edge of an odd rank, for example, of signal 0, and multiplexer MUX2 is switched at each falling edge of an even rank.

Additionally, at each rising edge of signal 0, signal SW switches. The new state of signal SW is transmitted to the selection inputs of multiplexers MUX3 and MUX4 only if the output signal O2 of multiplexer MUX4 has an active edge, for example, a rising edge. Then, the output signals of multiplexers MUX3 and MUX4 are inverted.

With this configuration, the selection of the initial state of latch 3C of the switched multiplexer MUX1 or MUX2 having its output selected by multiplexer MUX4, prior to the occurrence of a rising edge of signal 0, provides the current signal Si at output O1, and, at the output O2, the next signal Si+1 to be selected.

The following table better exemplifies this operation. The first column indicates the states of signal 0, and the second to fifth columns indicate successive signals S transmitted by multiplexers MUX1–MUX4, respectively.

| O | MUX1 | MUX2 | MUX3 (O1) | MUX4 (O2) |
|---|------|------|-----------|-----------|
| 0 | S1 | S2 | S1 | S2 |
| 1 | S1 | S2 | S2 | S1 |
| 0 | S3 | S2 | S2 | S3 |
| 1 | S3 | S2 | S3 | S2 |
| 0 | S3 | S4 | S3 | S4 |
| 1 | S3 | S4 | S4 | S3 |
| 0 | S5 | S4 | S4 | S5 |
| ... | ... | ... | ... | ... |

Figure 4:
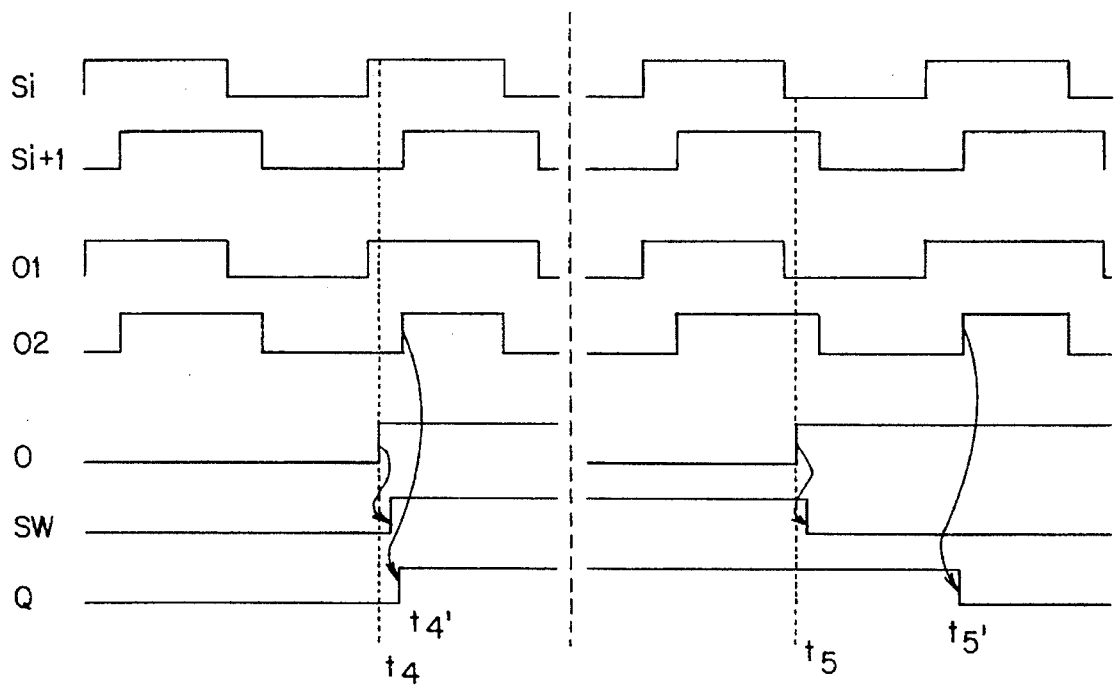
FIG. 4 represents timing diagrams of signals of the multiplexer of FIG. 3.

FIG. 4 represents timing diagrams of the signals of the circuit of FIG. 3 in two different situations represented on both sides of a vertical central line drawn in dot-and-dash line. FIG. 4 shows the current signal Si; the next signal Si+1 to be selected; the output signal O1 of multiplexer MUX3; the output signal O2 of multiplexer MUX4; the switching signal 0 (or output signal of the divider by $2^{m+1}/2$); signal SW provided by the control circuit to latch 30; and the selection signal Q of multiplexers MUX3 and MUX4.

Figure 1:
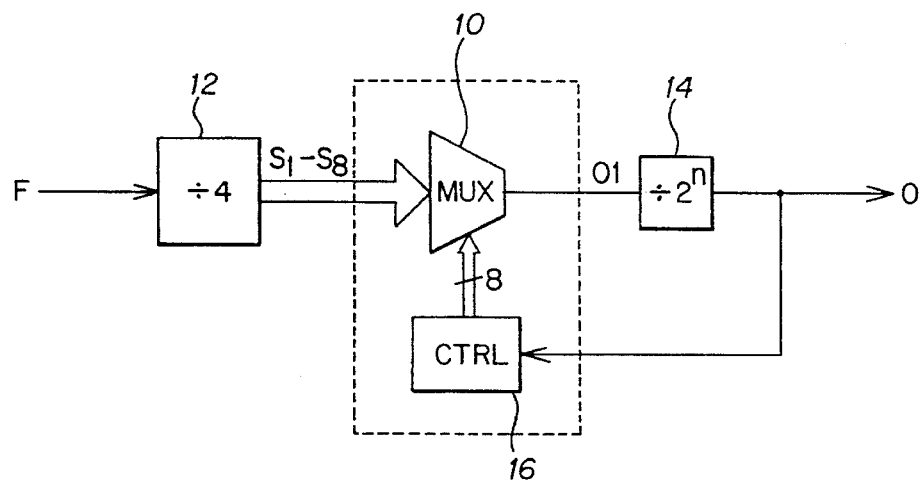
FIG. 1, above described, represents a conventional divider by $2^{m+}\frac{1}{2}$.
Figure 2:
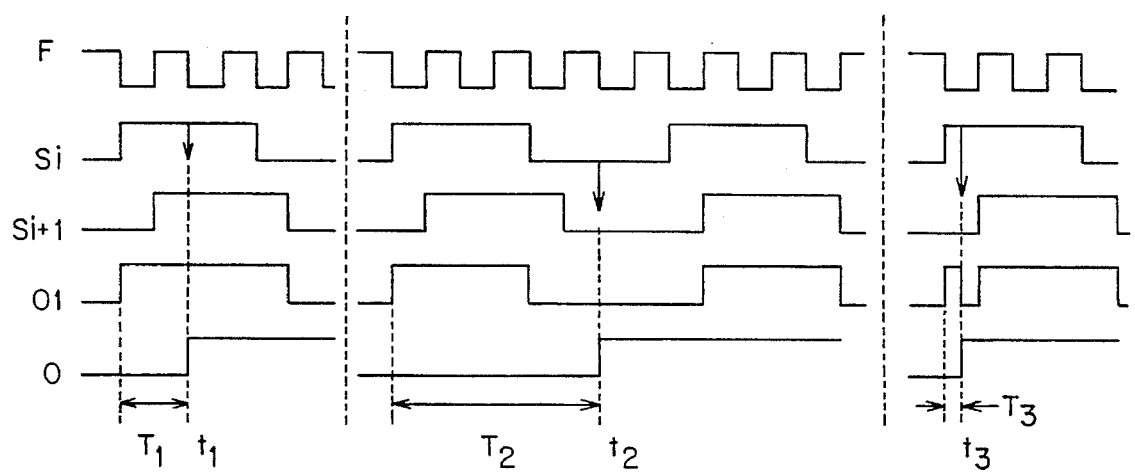
FIG. 2 represents a timing diagram of the signals of the circuit of FIG. 1.

On the left-hand portion of FIG. 4, an active edge, for example a rising edge, of signal 0 occurs at time $t_4$ while signal Si is high and signal Si+1 is low, which corresponds to an undesirable situation in the circuit of FIG. 1. Up to time $t_4$, signal O1 is equal to signal Si, and signal O2 is equal to signal Si+1 (in the given example, up to time $t_4$, signal Si is provided by multiplexer MUX2, and signal Si+1 is provided by multiplexer MUX1).

Signal SW switches to a high level shortly after the edge of signal. 0. However, signal SW is transmitted to output Q only at the next rising edge of signal O2 at time $t_4'$. Thus, switching from signal Si to signal Si+1 occurs at time $t_4'$ when signals Si and Si+1 are at the same state 1. As above described, switching of multiplexers MUX1 and MUX2 is carried out by the control circuit 32 at the next falling edge of signal 0 only. Then, only the multiplexer MUX1 or MUX2, whose output is transmitted by multiplexer MUX4, is switched.

On the right-hand portion of FIG. 4, a rising edge of signal 0 occurs while signal Si is low and signal Si+1 is high, which corresponds to the second undesirable situation of the circuit of FIG. 1. Signal SW switches to low state a short time later but, as in the previous case, this state is transmitted to the selection input of multiplexers MUX3 and MUX4 only at the next rising edge, at time $t_5'$, of signal O2 Time $t_5'$ corresponds to time $t_4'$ above described Thus, switching from a current signal Si to a next signal Si+1 to be selected occurs, independently of the arrival time of the active edge of signal 0, immediately after a phase when signals Si and Si+1 are at different states. Of course, switching occurs with a slight delay corresponding to the delay introduced by latch 30 and by the switching of multiplexers MUX3 and MUX4. Even if the circuit operates at the maximum frequency authorized by counter 12 (that is assumed to be fabricated in the same technology as the multiplexer according to the invention), this delay remains lower than the duration of the phase following the edge of signal O2, when signals Si and Si+1 are in the same state.

Figure 5:
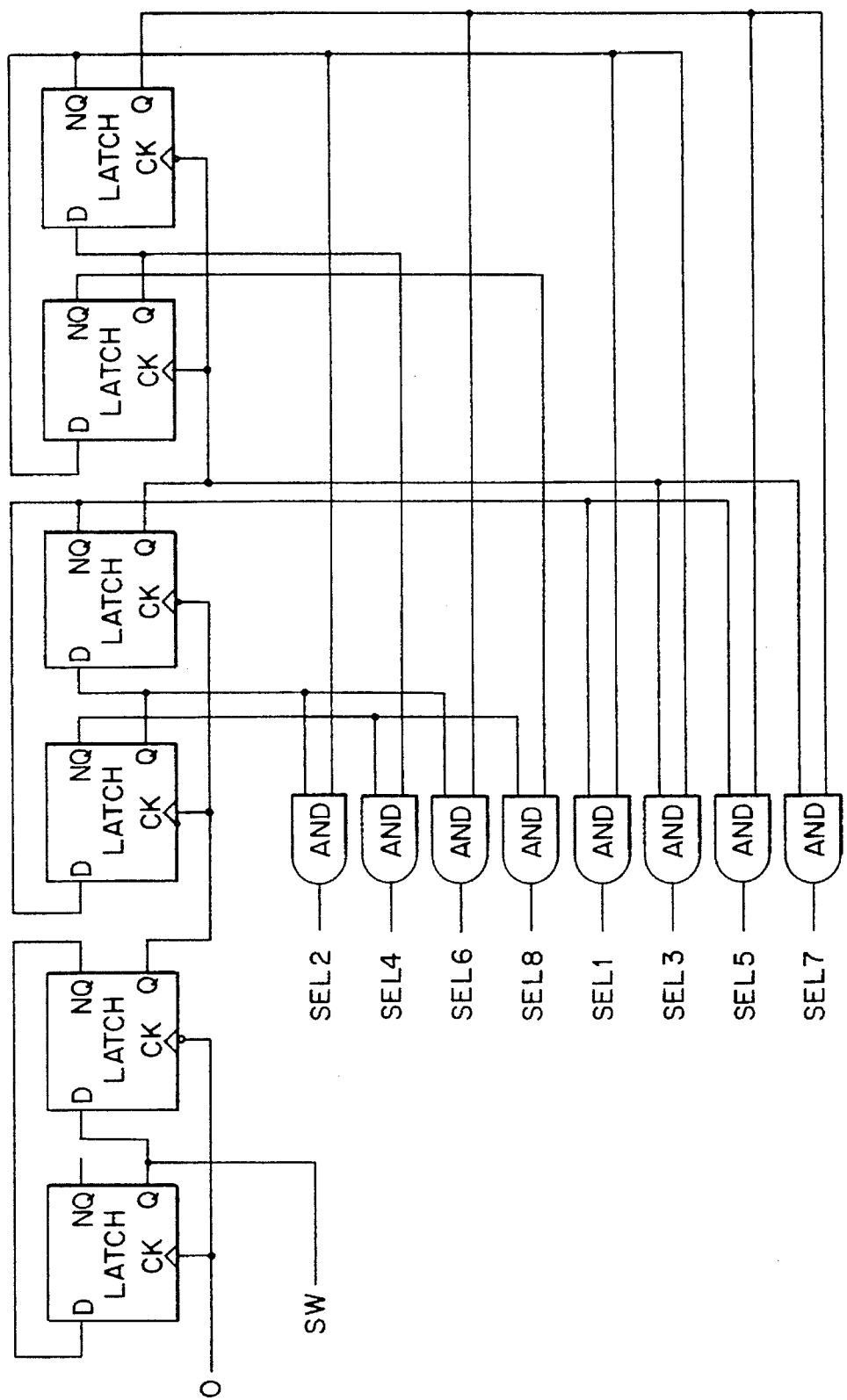
FIG. 5 represents a control circuit of the multiplexer of FIG. 3.

FIG. 5 represents an embodiment of the control circuit 32 providing the above-described functions, i.e., the selection of signals S in multiplexers MUX1 and MUX2 and the provision of signal SW. FIG. 5 should be considered as part of the present description. This circuit includes three dividers by 2 arranged in cascade, each of which is formed in a conventional way by two looped-back latches. Signal 0 is provided for the first divider by 2, and signal SW is drawn from the connection of the first latch to the second latch of the divider by 2. This arrangement reduces the delay between signal 0 and signal SW to the sole transfer delay of a latch.

The outputs of the latches of the next two dividers are exploited by a decoding circuit formed by AND gates, each output SEL1–SEL8 of which selects in the adequate multiplexer MUX1 or MUX2 the corresponding signal S1–S8 in the above described manner.

As is apparent to those skilled in the art, various modifications can be made to the above disclosed preferred embodiments, and in particular regarding the choice of the active edges of signals and the specific fabrication of the control circuit 32 to provide the described functions. Those skilled in the art will be capable of fabricating a multiplexer according to the invention including $2^q+1$ inputs.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A multiplexer system comprising:

a first multiplexer, receiving $2^q$ input signals of odd rank and providing an output signal; wherein 9 is an integer and greater or equal one a second multiplexer, coupled to the first multiplexer, receiving $2^q$ input signals of even rank and providing an output signal, the first multiplexer and the second multiplexer having a total of $2^q+1$ input terminals receiving periodic input signals, each input signal being out of phase with respect to the other input signals;

a third multiplexer, coupled to the first and second multiplexers, receiving at first and second multiplexers, respectively, and providing an output signal of the multiplexer system;

a fourth multiplexer, coupled to the first and second multiplexers, receiving at first and second inputs the output signals of the first and second multiplexers, respectively, and providing an output signal;

means, coupled to the multiplexer system, for switching the output signal from a present input signal to a next provided input signal in response to a switching signal, the next provided input signal having a phase lag with respect to the present input signal of $360/2^{q+1}$; and means, coupled to the means for switching, for synchronizing the switching signal with an edge of the next provided input signal.

2. A multiplexer system as claimed in claim 1 wherein the means for synchronizing includes a latch, coupled to the fourth multiplexer, receiving at a data input the switching signal, receiving at a clock input the output signal of the fourth multiplexer, and providing a selection signal to the third and fourth multiplexers.

3. A multiplexer system as claimed in claim 2 wherein the means for switching includes a controlling means, coupled to the first and second multiplexers, for switching a selection of the first multiplexer at each odd receipt of the switching signal and switching a selection of the second multiplexer at each even receipt of the switching signal.

4. A multiplexer system comprising:

a first multiplexer, receiving a plurality of input signals of odd rank and providing an output signal;

a second multiplexer, coupled to the first multiplexer, receiving a plurality of input signals of even rank and providing an output signal, each input signal of the plurality of input signals of even rank and odd rank being out of phase with respect to the other input a third multiplexer, to the first and second multiplexers, receiving at first and second inputs the output signals of the first and second multiplexers, respectively, and providing an output signal of the multiplexer system;

a fourth multiplexer, coupled to the first and second multiplexers, receiving at first and second inputs the output signals of the first and second multiplexers, respectively, and providing an output signal;

a control circuit, coupled to the first multiplexer, the second multiplexer, the third multiplexer and the fourth multiplexer responsive to a switching signal, that controls a switching of the output signal from a present input signal to a next provided input signal; and a synchronizing circuit, coupled to the plurality of multiplexers and the control circuit, that synchronizes the switching signal with an edge of the next provided input signal.

5. A multiplexer system as claimed in claim 4 wherein the synchronizing circuit includes a latch, coupled to the fourth multiplexer, receiving at a data input the switching signal, receiving at a clock input the output signal of the fourth multiplexer, and providing a selection signal to the third and fourth multiplexers.

6. A multiplexer system as claimed in claim 5 wherein the control circuit includes a controller element, coupled to the first and second multiplexers, switching a selection of the first multiplexer at each odd receipt of the switching signal and switching a selection of the second multiplexer at each even receipt of the switching signal.

7. The multiplexer system as claimed in claim 6, wherein the controller element includes a plurality of divide by two circuits, cascaded in series; and a plurality of logic gates, responsive to the plurality of divide by two circuits, which select and output a plurality of selection signals for controlling the switching of the first multiplexer and the second multiplexer.

8. The multiplexer system as claimed in claim 7, wherein each divide by two circuit includes a first latch and a second latch, an input of the second latch being coupled to a first output of the first latch and a first output of the second latch being coupled to an input of the first latch.

9. The multiplexer system as claimed in claim 8, wherein the switching signal is derived from the first output of the first latch of a first of the plurality of divide by two circuits.

10. A method of controlling operation of a multiplexer system comprising the steps of:

providing a plurality of input signals to a first plurality of multiplexers, each input signal being out of phase with respect to the other input signals;

selecting a first input signal and a second input signal from the plurality of input signals, with the first plurality of multiplexers, in response to a first active edge of a switching signal;

transmitting each of the first input signal and the second input signal to a second plurality of multiplexers;

in response to a second active edge of the switching signal and if the first input signal and the second input signal are in the same logic state, controlling the second plurality of multiplexers to switch an output signal of the multiplexer system from the first input signal to the second input signal.

11. A method as claimed in claim 10 wherein the step of providing includes providing a plurality of odd rank input signals to a first multiplexer and a providing plurality of even rank input signals to a second multiplexer, the first and second multiplexers respectively providing the first input signal and the second input signal as an output signal.

12. A method as claimed in claim 11, wherein the step of selecting includes the step of switching a selection of the first multiplexer at each odd receipt of the switching signal and switching a selection of the second multiplexer at each even receipt of the switching signal.

13. The method as claimed in claim 10, wherein the step of controlling switching of the second plurality of multiplexers includes ensuring that the switching of the second plurality of multiplexers always occurs after a state in which the first input signal and the second input signal are at different logic states.

14. A method as claimed in claim 13, wherein the step of ensuring includes synchronizing the switching signal with an active edge of the second input signal by clocking a latch element, responsive to the switching signal, with the second input signal so that the switching signal is output to the second plurality of multiplexers only upon the active edge of the second input signal.

15. The method as claimed in claim 10, wherein the first active edge of the switching signal is one of a rising edge and a falling edge and the second active edge of the switching signal is an other of the rising edge and the falling edge.

* * * * *

UNITED STATES PATENT AND TRADEMARK OFFICE

CERTIFICATE OF CORRECTION

PATENT NO. : 5,510,742

DATED : April 23, 1996

INVENTOR(S): Frederic Lemaire

It is certified that error appears in the above-identified patent and that said Letters Patent is hereby corrected as shown below:

Column 5, line 23, replace "9" with --$q$-- and

Column 5, line 28, replace "$2^q+1$" with --$2^{q+1}$--.

Signed and Sealed this

Seventh Day of April, 1998

Attest:

BRUCE LEHMAN

Attesting Officer        Commissioner of Patents and Trademarks